United States Patent
Ito et al.

(10) Patent No.: US 11,835,858 B2
(45) Date of Patent: Dec. 5, 2023

(54) PHOTO-CURABLE COMPOSITION AND METHODS FOR PREPARING CURED FILM, OPTICAL COMPONENT, CIRCUIT SUBSTRATE, ELECTRICAL COMPONENT AND REPLICA MOLD USING THE SAME

(71) Applicant: CANON KABUSHIKI KAISHA, Tokyo (JP)

(72) Inventors: Toshiki Ito, Kanagawa (JP); Fen Wan, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 166 days.

(21) Appl. No.: 17/320,920

(22) Filed: May 14, 2021

(65) Prior Publication Data

US 2021/0397088 A1     Dec. 23, 2021

Related U.S. Application Data

(60) Provisional application No. 63/041,192, filed on Jun. 19, 2020.

(51) Int. Cl.
| | |
|---|---|
| *G03F 7/027* | (2006.01) |
| *G03F 7/029* | (2006.01) |
| *C09K 21/14* | (2006.01) |
| *G03F 7/00* | (2006.01) |
| *H01L 21/027* | (2006.01) |
| *H01L 21/266* | (2006.01) |
| *G02B 3/08* | (2006.01) |
| *G02B 5/18* | (2006.01) |
| *G02B 5/30* | (2006.01) |

(52) U.S. Cl.
CPC ............. *G03F 7/027* (2013.01); *C09K 21/14* (2013.01); *G03F 7/0002* (2013.01); *G03F 7/0005* (2013.01); *G03F 7/029* (2013.01); *H01L 21/0274* (2013.01); *G02B 3/08* (2013.01); *G02B 5/1857* (2013.01); *G02B 5/3025* (2013.01); *H01L 21/266* (2013.01)

(58) Field of Classification Search
None
See application file for complete search history.

(56) References Cited

U.S. PATENT DOCUMENTS

| | | |
|---|---|---|
| 8,288,079 B2 | 10/2012 | Ogino et al. |
| 2019/0264076 A1 | 8/2019 | Tanabe et al. |
| 2021/0163634 A1 | 6/2021 | Miyata |

FOREIGN PATENT DOCUMENTS

| | | | |
|---|---|---|---|
| CN | 106366755 A | * | 2/2017 |
| CN | 109952353 A | | 6/2019 |
| JP | 64-81813 A | | 3/1989 |

(Continued)

OTHER PUBLICATIONS

Machine translation of JP 3013-231897 (no date).*

(Continued)

*Primary Examiner* — Amanda C. Walke
(74) *Attorney, Agent, or Firm* — VENABLE LLP (57) ABSTRACT

An object is to provide a photo-curable composition having high dry etching resistance and high thermal stability. A photo-curable composition includes at least a polymerizable compound (A) and a photopolymerization initiator (B), and further includes at least one of a flame retarder (E) and a flame-retardant polymerizable compound (F).

20 Claims, 1 Drawing Sheet

(56) References Cited

FOREIGN PATENT DOCUMENTS

| | | | | | |
|---|---|---|---|---|---|
| JP | 10-186653 | A | | 7/1998 | |
| JP | 2001011109 | A | * | 1/2001 | ............. C08F 12/34 |
| JP | 2001261723 | A | * | 9/2001 | |
| JP | 2005-164816 | A | | 6/2005 | |
| JP | 3780554 | B2 | * | 5/2006 | |
| JP | 2007-186570 | A | | 7/2007 | |
| JP | 2008-274003 | A | | 11/2008 | |
| JP | 2013231897 | A | * | 11/2013 | |
| JP | 2018-070844 | A | | 5/2018 | |
| JP | 2020-158765 | A | | 10/2020 | |
| TW | 200844655 | A | | 11/2008 | |
| TW | 202013093 | A | | 4/2020 | |
| WO | WO-0174826 | A1 | * | 10/2001 | ............. C07F 9/091 |
| WO | 2008/108357 | A1 | | 9/2008 | |
| WO | WO-2018179336 | A1 | * | 10/2018 | ............. C03C 17/32 |

OTHER PUBLICATIONS

Machine translation of WO 2008/108357 (no date).*
Machine translation of JP 2018-070844 (no date).*
International Search Report and Written Opinion in International Application No. PCT/JP2021/021841 (dated Aug. 2021).
Office Action in Taiwanese Application No. 110122061 (dated Jun. 2023).

* cited by examiner

PHOTO-CURABLE COMPOSITION AND METHODS FOR PREPARING CURED FILM, OPTICAL COMPONENT, CIRCUIT SUBSTRATE, ELECTRICAL COMPONENT AND REPLICA MOLD USING THE SAME

BACKGROUND OF THE INVENTION

Field of the Invention

The present disclosure relates to a photo-curable composition and methods for preparing a cured film, an optical component, a circuit substrate, an electrical component, and a replica mold using the same.

Description of the Related Art

There has been an increasing demand for miniaturization for semiconductor devices, MEMS, and the like, and a photo-nanoimprinting technique has been drawing attention as a microprocessing technique.

In the photo-nanoimprinting technique, a mold (mold) with a minute concavo-convex pattern formed on its surface is pressed against a substrate (wafer) coated with a photo-curable composition (resist), and the photo-curable composition is cured in this state. As a result, the concavo-convex pattern on the mold is transferred to the cured film of the photo-curable composition, and the concavo-convex pattern is formed on the substrate. With the photo-nanoimprinting technique, it is possible to form a minute structure on the order of several nanometers on a substrate.

In a photo-nanoimprinting technique disclosed in Japanese Patent Application Laid-Open No. 2007-186570, firstly, a resist is coated onto a pattern formation region on a substrate (arranging step). Then, this resist is shaped using a mold on which a pattern is formed (mold contacting step). Thereafter, light is applied to cure the resist (light applying step), and then the mold is detached from the resist (releasing step). By performing these steps, a resin pattern (photo-cured film) having a predetermined shape is formed on the substrate.

SUMMARY OF THE INVENTION

A cured film with a pattern formed on a substrate by the photo-nanoimprinting technique is sometimes utilized as a mask for processing the underlying substrate using a dry etching technique. In this case, the photo-curable composition is required to have high dry etching resistance in order to process the underlying substrate at a high yield. The photo-curable composition is also required to have thermal stability since heat of radical generating is generated during the dry etching. The dry etching resistance and the thermal stability of the photo-curable composition are determined by the constitution of the photo-curable composition.

In view of this, an object of the present disclosure is to provide a photo-curable composition having high dry etching resistance and high thermal stability.

According to an embodiment of the present disclosure, a photo-curable composition is provided which includes at least a polymerizable compound (A) and a photopolymerization initiator (B), and further includes at least one of a flame retarder (E) and a flame-retardant polymerizable compound (F).

According to an embodiment of the present disclosure, a method for preparing a cured film is provided which includes: an arranging step of arranging the above-described photo-curable composition onto a substrate; a pressing step of bringing the photo-curable composition and a mold into contact with each other; a light applying step of applying light onto the photo-curable composition to turn the photo-curable composition into a cured product; and a releasing step of detaching the cured product and the mold from each other after the light applying step.

According to an embodiment of the present disclosure, a method for preparing an optical component is provided which includes a step of obtaining a cured film with a pattern by the above-described method for preparing a cured film.

According to an embodiment of the present disclosure, a method for preparing a circuit substrate is provided which includes: a step of obtaining a cured film by the above-described method for preparing a cured film; and a step of performing etching or ion implantation on the substrate by using the obtained cured product pattern as a mask.

According to an embodiment of the present disclosure, a method for preparing a replica mold is provided which includes the above method for preparing a cured film, and in which the substrate is a quartz substrate.

According to an embodiment of the present disclosure, a method for preparing a cured film is provided which includes, in this order: an arranging step of arranging droplets of the above-described photo-curable composition onto a substrate having a surface with asperities by dropping the droplets discretely; a waiting step of waiting until a surface of a layer of the photo-curable composition becomes plane; and a light applying step of applying light to cure the layer of the photo-curable composition.

According to the present disclosure, it is possible to provide a photo-curable composition having high dry etching resistance and high thermal stability.

Further features of the present disclosure will become apparent from the following description of exemplary embodiments with reference to the attached drawing.

BRIEF DESCRIPTION OF THE DRAWINGS

FIG. 1s a set of schematic cross-sectional views illustrating an example of a method for preparing a cured film according to an embodiment.

DESCRIPTION OF THE EMBODIMENTS

Embodiments of the present disclosure will be described below in detail with reference to the drawing as appropriate. It is to be noted that the present disclosure is not limited to the embodiments to be described below. Moreover, the scope of the present disclosure also encompasses embodiments obtained by making changes, modifications, or the like to the embodiments to be described below as appropriate based on ordinary knowledge of those skilled in the art without departing from the gist of the present disclosure.

[Photo-Curable Composition]

A photo-curable composition according to an embodiment is a composition having a component (A) being a polymerizable compound and a component (B) being a photopolymerization initiator. The photo-curable composition according to this embodiment may further contain a flame retarder (E) or/and a flame-retardant polymerizable compound (F). The photo-curable composition according to this embodiment may further contain a component (C) being a non-polymerizable compound.

Also, in this description, a "cured film" means a film obtained by polymerizing and thus curing a photo-curable composition on a substrate. Note that the shape of a cured film is not particularly limited. The surface of the cured film may have a pattern shape, or the surface of the cured film may be planer than the surface of the underlying substrate.

Each component will be described in detail below.

<Component (A): Polymerizable Compound>

The component (A) is a polymerizable compound. Here, in this description, a "polymerizable compound" is a compound that reacts with a polymerization factor (such as radical) generated from a photopolymerization initiator (component (B)) to form a film made of a polymeric compound as a result of a chain reaction (polymerization reaction).

Examples of such a polymerizable compound include radical polymerizable compounds. The polymerizable compound being the component (A) may be made solely of one kind of polymerizable compound or made of a plurality of kinds of polymerizable compounds.

The radical polymerizable compounds are preferably compounds having one or more acryloyl groups or methacryloyl groups, i.e., (meth)acrylic compounds. Thus, it is preferable that the photo-curable composition according to this embodiment contain a (meth)acrylic compound as the component (A). It is more preferable that the main component of the component (A) be the (meth)acrylic compound. It is most preferable that the component (A) be the (meth) acrylic compound. Note that when the main component of the component (A) is a (meth)acrylic compound as mentioned here, it means that 90 wt % or more of the component (A) is the (meth)acrylic compound.

When the radical polymerizable compound is made of a plurality of kinds of compounds having one or more acryloyl groups or methacryloyl groups, it is preferable that the radical polymerizable compound contain a monofunctional (meth)acrylic monomer and a multifunctional (meth)acrylic monomer. This is because a cured film with high mechanical strength can be obtained by combining a monofunctional (meth)acrylic monomer and a multifunctional (meth)acrylic monomer.

Examples of monofunctional (meth)acrylic compounds having one acryloyl group or methacryloyl group include, but are not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenol (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth) acrylate, 2-ethyl-2-adamantyl (meth)acrylate, bornyl (meth) acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloylmorpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth) acrylate, isopropyl (meth)acrylate, butyl (meth)acrylate, amyl (meth)acrylate, isobutyl (meth)acrylate, t-butyl (meth) acrylate, pentyl (meth)acrylate, isoamyl (meth)acrylate, hexyl (meth)acrylate, heptyl (meth)acrylate, octyl (meth) acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth) acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxydiethylene glycol (meth)acrylate, polyethylene glycol mono(meth)acrylate, polypropylene glycol mono(meth) acrylate, methoxyethylene glycol (meth)acrylate, ethoxyethyl (meth)acrylate, methoxypolyethylene glycol (meth) acrylate, methoxypolypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth) acrylate, N,N-diethyl (meth)acrylamide, N,N-dimethylaminopropyl (meth)acrylamide, and the like.

Commercially-available products of the above monofunctional (meth)acrylic compounds include, but are not limited to: Aronix M101, M102, M110, M111, M113, M117, M5700, TO-1317, M120, M150, and M156 (which are manufactured by TOAGOSEI CO., LTD.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (which are manufactured by OSAKA ORGANIC CHEMICAL INDUSTRY LTD.); LIGHT ACRYLATE BO-A, EC-A, DMP-A, THF-A, HOP-A, HOA-MPE, HOA-MPL, PO-A, P-200A, NP-4EA, and NP-8EA and EPOXY ESTER M-600A (which are manufactured by Kyoeisha Chemical Co., Ltd.); KAYARAD TC110S, R-564, and R-128H (which are manufactured by Nippon Kayaku Co., Ltd.); NK ester AMP-10G and AMP-20G (which are manufactured by Shin-Nakamura Chemical Co., Ltd.); FA-511A, 512A, and 513A (which are manufactured by Hitachi Chemical Co., Ltd.); PHE, CEA, PHE-2, PHE-4, BR-31, BR-31M, and BR-32 (which are manufactured by DAI-ICHI KOGYO SEIYAKU CO., LTD.); VP (which is manufactured by BASF); ACMO, DMAA, and DMAPAA (which are manufactured by KOHJIN); and the like.

Examples of multifunctional (meth)acrylic compounds having two or more acryloyl groups or methacryloyl groups include, but are not limited to, trimethylolpropane di(meth) acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth) acrylate, neopentyl glycol di(meth)acrylate, 1,9-nonanediol di(meth)acrylate, 1,10-decanediol di(meth)acrylate, 1,3-adamantanedimethanol di(meth)acrylate, tris(2-hydroxyethyl)isocyanurate tri(meth)acrylate, tris(acryloyloxy)isocyanurate, bis(hydroxymethyl)tricyclodecane di(meth) acrylate, dipentaerythritol penta(meth)acrylate, dipentaerythritol hexa(meth)acrylate, EO-modified 2,2-bis (4-((meth)acryloxy)phenyl)propane, PO-modified 2,2-bis(4-((meth)acryloxy)phenyl)propane, EO,PO-modified 2,2-bis (4-((meth)acryloxy)phenyl)propane, and the like.

Commercially-available products of the above multifunctional (meth)acrylic compounds include, but are not limited to: Yupimer UV SA1002 and SA2007 (which are manufactured by Mitsubishi Chemical Corporation); Viscoat #195, #230, #215, #260, #335HP, #295, #300, #360, #700, GPT, and 3PA (which are manufactured by OSAKA ORGANIC CHEMICAL INDUSTRY LTD.); LIGHT ACRYLATE 4EG-A, 9EG-A, NP-A, DCP-A, BP-4EA, BP-4PA, TMP-A, PE-3A, PE-4A, and DPE-6A (which are manufactured by Kyoeisha Chemical Co., Ltd.); KAYARAD PET-30, TMPTA, R-604, DPHA, DPCA-20, -30, -60, and -120, HX-620, D-310, and D-330 (which are manufactured by Nippon Kayaku Co., Ltd.); Aronix M208, M210, M215, M220, M240, M305, M309, M310, M315, M325, and M400 (which are manufactured by TOAGOSEI CO., LTD.); Ripoxy VR-77, VR-60, and VR-90 (which are manufactured by Showa High Polymer Co., Ltd.); and the like.

Note that the (meth)acrylate in the above compounds means an acrylate or a methacrylate having an alcohol residue equivalent thereto. A (meth)acryloyl group means an acryloyl group or a methacryloyl group having an alcohol residue equivalent thereto. EO denotes ethylene oxide, and an EO-modified compound A refers to a compound in which a (meth)acrylic acid residue and an alcohol residue of the compound A are bonded to each other through the block structure of an ethylene oxide group. Also, PO denotes propylene oxide, and a PO-modified compound B refers to a compound in which a (meth)acrylic acid residue and an alcohol residue of the compound B are bonded to each other through the block structure of a propylene oxide group.

Advantageously, the formulation ratio of the component (A) being a polymerizable compound in the photo-curable composition is 40 parts by weight or more and 99 parts by weight or less when the total of all components excluding a solvent being a component (D) is 100 parts by weight. The formulation ratio is preferably 50 parts by weight or more and 95 parts by weight or less, and more preferably 60 parts by weight or more and 90 parts by weight or less. If the component (A) is less than 40 parts by weight, the mechanical strength of the cured film will be low. If the component (A) is more than 99 parts by weight, the amount of the component (B) to be described below is so low that sufficient curing will not be achieved.

<Component (B): Photopolymerization Initiator>

The component (B) is a photopolymerization initiator.

In this description, a "photopolymerization initiator" is a compound that generates the above-mentioned polymerization factor (radical) by sensing light of predetermined wavelengths. Specifically, a photopolymerization initiator is a polymerization initiator (radical generator) that generates a radical by means of light (a radiation such as infrared rays, visible rays, ultraviolet rays, far-ultraviolet rays, X rays, or charged-particle beams including electron rays).

The component (B) may be made of one kind of photopolymerization initiator or made of a plurality of kinds of photopolymerization initiators.

Examples of the radical generator include, but are not limited to: 2,4,5-triarylimidazole dimers that may have substituents such as 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, and 2-(o- or p-methoxyphenyl)-4,5-diphenylimidazole dimer; benzophenone and benzophenone derivatives such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; a-amino aromatic ketone derivatives such as 2-benzyl-2-dimethylamino-1-(4-morpholinophenyl)-butanone-1 and 2-methyl-1-[4-(methylthio)phenyl]-2-morpholino-propane-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin and benzoin derivatives such as methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone and acetophenone derivatives such as 3-methylacetophenone, acetophenone benzyl ketal, 1-hydroxycyclohexyl phenyl ketone, and 2,2-dimethoxy-2-phenylacetophenone; thioxanthone and thioxanthone derivatives such as diethylthioxanthone, 2-isopropylthioxanthone, and 2-chlorothioxanthone; acylphosphine oxide derivatives such as 2,4,6-trimethylbenzoyl diphenylphosphine oxide, bis(2,4,6-trimethylbenzoyl)phenylphosphine oxide, and bis-(2,6-dimethoxybenzoyl)-2,4,4-trimethylpentylphosphine oxide; oxime ester derivatives such as 1,2-octanedione, 1-[4-(phenylthio)phenyl]-, 2-(O-benzoyloxime) (trade name: Irgacure OXE01), ethanone, 1-[9-ethyl-6-(2-methylbenzoyl)-9H-carbazol-3-yl]-, and 1-(O-acetyloxime) (trade name: Irgacure OXE02); xanthone; fluorenone; benzaldehyde; fluorene; anthraquinone; triphenylamine; carbazol; 1-(4-isopropylphenyl)-2-hydroxy-2-methylpropane-1-one; 2-hydroxy-2-methyl-1-phenylpropane-1-one; and the like.

Commercially-available products of the above radical generators include, but are not limited to, Irgacure 184, 369, 651, 500, 819, 907, 784, and 2959, CGI-1700, -1750, and -1850, and CG24-61, Darocur 1116 and 1173, Lucirin TPO, LR8893, and LR8970 (which are manufactured by BASF), Ubecryl P36 (manufactured by UCB), and the like.

It is preferable that the component (B) be an acylphosphine oxide-based polymerization initiator among these. Note that among the above examples, the acylphosphine oxide-based polymerization initiator is an acylphosphine oxide compound such as 2,4,6-trimethylbenzoyl diphenylphosphine oxide, bis(2,4,6-trimethylbenzoyl)phenylphosphine oxide, and bis-(2,6-dimethoxybenzoyl)-2,4,4-trimethylpentylphosphine oxide.

Advantageously, the formulation ratio of the component (B) being a photopolymerization initiator in the photo-curable composition is 0.1 part by weight or more and 50 parts by weight or less when the total of all components excluding the solvent being the component (D) is 100 parts by weight. Also, the formulation ratio is preferably 0.1 part by weight or more and 20 parts by weight or less, and more preferably more than 10 parts by weight and 20 parts by weight or less.

By setting the formulation ratio of the component (B) at 0.1 part by weight or more with respect to the total of the component (A), the component (B), and the component (C), the rate of curing of the composition is high, which enables a good reaction efficiency. Also, by setting the formulation ratio of the component (B) at 50 parts by weight or less with respect to the total of the component (A), the component (B), and the component (C), the obtained cured film can be a cured film having a certain degree of mechanical strength.

<Component (C): Non-Polymerizable Compound>

In addition to the above-described component (A) and component (B), the photo-curable composition according to this embodiment can further contain a non-polymerizable compound as the component (c) according to various purposes within such an extent range that the effect of the present disclosure is not impaired. The component (C) is preferably a non-volatile compound. Here, "non-volatile" in this description means being not easily volatilizable or evaporable into the air at normal temperature and normal pressure. On the other hand, "volatile" in this description means being easily volatizable or evaporable into the air at normal temperature to 150° C. and normal pressure. Such a component (C) includes compounds that have neither a polymerizable functional group such as a (meth)acryloyl group nor an ability to generate the above-mentioned polymerization factor (radical) by sensing light of the predetermined wavelengths. Examples include a sensitizer, a hydrogen donor, an internal release agent, a surfactant, an antioxidant, a polymer component, other additives, and so on. The component (C) may contain two or more of the above compounds.

The sensitizer is a compound to be added as appropriate for the purpose of promoting the polymerization reaction and improving the polymerization conversion. Examples of the sensitizer include a sensitizing dye and the like.

The sensitizing dye is a compound that becomes excited by absorbing light of particular wavelengths and interacts with the photopolymerization initiator being the component (B). Note that the interaction mentioned here is energy transfer, electron transfer, or the like from the sensitizing dye in the excited state to the photopolymerization initiator being the component (B).

Specific examples of the sensitizing dye include, but are not limited to, an anthracene derivative, an anthraquinone derivative, a pyrene derivative, a perylene derivative, a carbazol derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, a pyrylium salt-based dye, and the like.

One kind of sensitizer may be used alone, or a mixture of two or more kinds of sensitizers may be used.

The hydrogen donor is a compound that reacts with an initiation radical generated from the photopolymerization initiator being the component (B) or with the radical of a polymerization growth terminal to generate a more reactive radical. The hydrogen donor is preferably added when the photopolymerization initiator being the component (B) is a photoradical generator.

Specific examples of such a hydrogen donor include, but are not limited to: amine compounds such as n-butylamine, di-n-butylamine, tri-n-butylphosphine, allylthiourea, s-benzylisothiouronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine; mercapto compounds such as 2-mercapto-N-phenylbenzimidazole and mercaptopropionic acid ester; and the like.

One kind of the hydrogen donors may be used alone, or a mixture of two or more kinds thereof may be used. Also, the hydrogen donor may have the function of a sensitizer.

An internal release agent may be added to the photo-curable composition for the purpose of reducing the strength of the interfacial bond between a mold and a resist, i.e., reducing the releasing force in a later-described releasing step. In this description, the "internal type" means that the release agent is added to the photo-curable composition in advance before a step of arranging the photo-curable composition.

As the internal release agent, surfactants such as a silicone-based surfactant, a fluorine-based surfactant, and a hydrocarbon-based surfactant, and the like are usable. Note that in this embodiment, the internal release agent is not polymerizable.

The fluorine-based surfactant includes: a polyalkylene oxide (such as polyethylene oxide or polypropylene oxide) adduct of an alcohol having a perfluoroalkyl group, a polyalkylene oxide (such as polyethylene oxide or polypropylene oxide) adduct of perfluoropolyether, and the like. Note that the fluorine-based surfactant may have a hydroxyl group, an alkoxy group, an alkyl group, an amino group, a thiol group, or the like on part (e.g., terminal group) of its molecular structure.

A commercially-available product may be used as the fluorine-based surfactant. Examples of the commercially-available product include: MEGAFACE F-444, TF-2066, TF-2067, and TF-2068 (which are manufactured by DIC Corporation); Fluorad FC-430 and FC-431 (which are manufactured by Sumitomo 3M Limited); SURFLON S-382 (manufactured by AGC); EFTOP EF-122A, 122B, and 122C, EF-121, EF-126, EF-127, and MF-100 (which are manufactured by Tohkem Products Corporation); PF-636, PF-6320, PF-656, and PF-6520 (which are manufactured by OMNOVA Solutions Inc.); UNIDYNE DS-401, DS-403, and DS-451 (which are manufactured by DAIKIN INDUSTRIES, LTD); FTERGENT 250, 251, 222F, and 208G (which are manufactured by NEOS COMPANY LIMITED); and the like.

Alternatively, the internal release agent may be a hydrocarbon-based surfactant.

The hydrocarbon-based surfactant includes an alkyl alcohol polyalkylene oxide adduct obtained by adding an alkylene oxide having 2 to 4 carbon atoms to an alkyl alcohol having 1 to 50 carbon atoms, and the like.

The alkyl alcohol polyalkylene oxide adduct includes a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, a stearyl alcohol ethylene oxide/propylene oxide adduct, and the like. Note that the terminal group of the alkyl alcohol polyalkylene oxide adduct is not limited to a hydroxyl group, which can be produced by simply adding a polyalkylene oxide to an alkyl alcohol. This hydroxyl group may be substituted with another substituent, e.g., a polar functional group such as a carboxyl group, an amino group, a pyridyl group, a thiol group, or a silanol group or with a hydrophobic functional group such as an alkyl group or an alkoxy group.

A commercially-available product may be used as the alkyl alcohol polyalkylene oxide adduct. Examples of the commercially-available product include: polyoxyethylene methyl ethers (methyl alcohol ethylene oxide adducts) manufactured by AOKI OIL INDUSTRIAL Co., Ltd. (BLAUNON MP-400, MP-550, and MP-1000); polyoxyethylene decyl ethers (decyl alcohol ethylene oxide adducts) manufactured by AOKI OIL INDUSTRIAL Co., Ltd. (FINESURF D-1303, D-1305, D-1307, and D-1310); a polyoxyethylene lauryl ether (lauryl alcohol ethylene oxide adduct) manufactured by AOKI OIL INDUSTRIAL Co., Ltd. (BLAUNON EL-1505); polyoxyethylene cetyl ethers (cetyl alcohol ethylene oxide adducts) manufactured by AOKI OIL INDUSTRIAL Co., Ltd. (BLAUNON CH-305 and CH-310); polyoxyethylene stearyl ethers (stearyl alcohol ethylene oxide adducts) manufactured by AOKI OIL INDUSTRIAL Co., Ltd. (BLAUNON SR-705, SR-707, SR-715, SR-720, SR-730, and SR-750); random polymerization-type polyoxyethylene polyoxypropylene stearyl ethers manufactured by AOKI OIL INDUSTRIAL Co., Ltd. (BLAUNON SA-50/50 1000R and SA-30/70 2000R); a polyoxyethylene methyl ether manufactured by BASF (Pluriol A760E); polyoxyethylene alkyl ethers manufactured by Kao Corporation (EMULGEN series); and the like.

Among these hydrocarbon-based surfactants, the internal release agent is preferably an alkyl alcohol polyalkylene oxide adduct and more preferably a long-chain alkyl alcohol polyalkylene oxide adduct.

One kind of the internal release agents may be used alone, or a mixture of two or more kinds thereof may be used.

Advantageously, the formulation ratio of the component (C) being a non-polymerizable compound in the photo-curable composition is 0 part by weight or more and 50 parts by weight or less when the total of all components excluding the solvent being the component (D) is 100 parts by weight. Also, the formulation ratio is preferably 0.1 part by weight or more and 50 parts by weight or less, and more preferably 0.1 part by weight or more and 20 parts by weight or less.

Also, by setting the formulation ratio of the component (B) at 50 parts by weight or less with respect to the total of the component (A), the component (B), and the component (C), the obtained cured film can be a cured film having a certain degree of mechanical strength.

<Component (D): Solvent>

The photo-curable composition according to this embodiment may contain a solvent as the component (D). The component (D) is not particularly limited as long as it is a solvent in which the component (A), the component (B), and the component (C) dissolve. Preferably, the component (D) is a solvent with a boiling point of 80° C. or higher and 200° C. or lower at normal pressure and is a volatile solvent. More preferably, the solvent is a solvent having at least one of an ester structure, a ketone structure, a hydroxyl group, and an ether structure. Specifically, the solvent is a single solvent selected from propylene glycol monomethyl ether acetate, propylene glycol monomethyl ether, cyclohexanone, 2-heptanone, y-butyrolactone, and lactate ethyl, or a mixed solvent thereof.

The content of the solvent in the photo-curable composition according to this embodiment can be adjusted according to the viscosity of the mixture of the component (A), the component (B), and the component (C), the method for coating the photo-curable composition, the target film thickness, and so on.

However, in the case of arranging (coating) the photo-curable composition according to this embodiment onto a substrate by an inkjet method, it is preferable that the photo-curable composition contain substantially no volatile solvent. Here, "containing substantially no volatile solvent" means containing no volatile solvent except unintentionally included volatile solvents such as impurities. Specifically, the content of volatile solvents in the photo-curable composition according to this embodiment is preferably 3 wt % or less and more preferably 1 wt % or less with respect to the entire photo-curable composition, for example. Without any volatile solvent contained, a baking step aimed at volatilizing a volatile solvent is not required after the photo-curable composition is arranged on a substrate. Hence, the process can be simplified.

On the other hand, in the case of arranging (coating) the photo-curable composition according to this embodiment onto a substrate by, for example, a spin coating method or the like, the photo-curable composition may contain a volatile solvent as the component (D). Containing the solvent in the photo-curable composition can lower the viscosity of the photo-curable composition, and is preferable in the case where the film thickness of a coated film of the photo-curable composition is to be, for example, 500 nm or less, or in other similar cases.

<Component (E): Flame Retarder>

The photo-curable composition according to this embodiment, in one form, contains a flame retarder as the component (E). Flame retarders have been widely known as agents that inhibit combustion with their effects such as stabilization of active OH radicals and oxygen radicals. Photo-curable compositions for nanoimprint lithography are required to have dry etching resistance after a step. Dry etching resistance is mainly chemical stability against active radicals. Thus, adding a flame retarder as an additive can impart dry etching resistance to the entire cured film. The flame retarder being the component (E) may be made solely of one kind of flame retarder or made of a plurality of kinds of flame retarders.

Examples of the flame retarder include brominated phenyl compounds such as pentabromodiphenyl ether, octabromodiphenyl ether, decabromodiphenyl, decabromodiphenyl ether, tetrabromobisphenol A, hexabromocyclododecane, hexabromobenzene, pentabromotoluene, bis(tribromophenoxy)ethane, tetrabromophthalic anhydride, ethylene bis(tetrabromophthalimide), ethylene bis(pentabromophenyl), octabromotrimethylphenylindane, brominated polystyrenes, brominated polybenzyl acrylates, brominated epoxy oligomers, brominated phenoxy resin, brominated polycarbonate oligomers, tetrabromobisphenol A derivatives such as tetrabromobisphenol A, tetrabromobisphenol A-bis (2,3-dibromopropyl ether), tetrabromobisphenol A-bis(allyl ether), and tetrabromobisphenol A-bis(hydroxyethyl ether), bromine-containing triazine-based compounds such as tris (tribromophenoxy)triazine, and bromine-containing isocyanuric acid-based compounds such as tris(2,3-dibromopropyl)isocyanurate, condensed phosphate ester compounds such as resorcinol bis(diphenyl)phosphate, 1,3-phenylene bis(diphenyl phosphate), 1,3-phenylene bis(dixylenyl)phosphate, bisphenol A bis(diphenyl phosphate), and phosphonitrilic acid phenyl ester, halogen-containing phosphate ester compounds such as tris(chloroethyl)phosphate, tris(2,3-dichloropropyl)phosphate, tris(2-chloropropyl)phosphate, tris(2,3-bromopropyl) phosphate, tris(bromochloropropyl)phosphate, 2,3-dibromopropyl-2,3-chloropropyl phosphate, tris(tribromophenyl) phosphate, tris(dibromophenyl)phosphate, and tris (tribromoneopentyl)phosphate non-halogen-based aliphatic phosphate ester compounds such as trimethyl phosphate, triethyl phosphate, tributyl phosphate, trioctyl phosphate, and tributoxyethyl phosphate, non-halogen-based aromatic phosphate ester compounds such as triphenyl phosphate, cresyl diphenyl phosphate, dicresyl phenyl phosphate, tricresyl phosphate, trixylenyl phosphate, xylenyl diphenyl phosphate, tris(isopropylphenyl)phosphate, isopropylphenyl diphenyl phosphate, diisopropylphenyl phenyl phosphate, tris(trimethylphenyl)phosphate, tris(t-butylphenyl)phosphate, hydroxyphenyl diphenyl phosphate, octyl diphenyl phosphate, triallyl phosphate, and melamine polyphosphate, melamine compounds such as melamine cyanurate, chlorinated paraffin, polychlorinated biphenyl, BestBoron, SOUFA, tris(2,4-ditertiary butylphenyl)phosphite, 2,6-ditertiary butyl-4-(4,6-bis(octylthio)-1,3,5-triazine-2-ylamino)phenol, didodecyl-3,3'-thiodipropionate, and the like.

Advantageously, the formulation ratio of the component (E) being a flame retarder in the photo-curable composition is 1 part by weight or more and 50 parts by weight or less when the total of all components excluding the solvent being the component (D) is 100 parts by weight. The formulation ratio is preferably 5 parts by weight or more and 30 parts by weight or less, and more preferably 10 parts by weight or more and 20 parts by weight or less.

If the formulation ratio of the component (E) in the photo-curable composition is less than 1 part by weight, it will be impossible to achieve an effect of improving the dry etching resistance and thermal stability. If the formulation ratio is more than 50 parts by weight, the mechanical strength of the cured film will be low.

<Component (F): Flame-Retardant Polymerizable Compound>

The photo-curable composition according to this embodiment, in one form, contains a flame-retardant polymerizable compound as the component (F).

Here, the "flame-retardant polymerizable compound (F)" refers to a compound containing both a flame retardant structure such as a brominated phenyl group or a phosphate ester group and a polymerizable functional group within a single molecule. The flame-retardant polymerizable compound being the component (F) may be made solely of one kind of flame-retardant polymerizable compound or made of a plurality of kinds of flame-retardant polymerizable compounds. The flame retardant structure is not limited to a brominated phenyl group or a phosphate ester group.

The flame-retardant polymerizable compound is characterized in that it is copolymerized with the component (A), which is a polymerizable compound, and incorporated into a polymer network, thus further enhancing the dry etching resistance and thermal stability of the cured film.

Examples of the polymerizable compound having a brominated phenyl group include brominated (meth)acrylates as disclosed in the description of Japanese Patent Application Laid-Open No. 2005-164816, which can be obtained from brominated phenols expressed by the general formula (1) below and a (meth)acrylic acid.

Formula (1)

$R_1$, $R_2$, $R_3$, $R_4$, and $R_5$ in the formula (1) are hydrogen, an alkyl group, or bromine, and at least one of $R_1$, $R_2$, $R_3$, $R_4$, and $R_5$ is bromine. Brominated phenols expressed by the general formula (1) specifically include 2,6-dibromonophenol, 2,4,6-tribromophenol, 2,3,4,5,6-pentabromophenol, and the like. Examples of the method for producing the brominated (meth)acrylates include, but are not particularly limited to, a method involving reacting the brominated phenols with acrylic acid chloride or methacrylic acid chloride, and the like. The above brominated (meth)acrylates may be EO-modified. Commercially-available products include tribromophenyl acrylate (such as "BR-30" manufactured by DAI-ICHI KOGYO SEIYAKU CO., LTD.) and EO-modified tribromophenyl acrylate (such as "BR-31" manufactured by DAI-ICHI KOGYO SEIYAKU CO., LTD.).

Other polymerizable compounds having a brominated phenyl group include, but are not limited to, (meth)acrylates such as pentabromobenzyl (meth)acrylate (such as "FR-1025M" manufactured by ICL-IP JAPAN Ltd.), brominated styrene, tribromophenoxyethyl acrylate, EO-modified tribromophenoxyethyl acrylate, tribromoneopentyl alcohol acrylate, tetrabromobisphenol A-bis(meth)acrylate and EO-modified tetrabromobisphenol A-bis(meth)acrylate with a brominated bisphenol A structure as disclosed in Japanese Patent Application Laid-Open Nos. H10-186653 and S64-081813, and the like.

Examples of polymerizable compounds having a phosphate ester group include, but are not limited to, 2-methacryloyloxyethyl acid phosphate (such as "MR-200" manufactured by DAIHACHI CHEMICAL INDUSTRY CO., LTD.), diphenyl-(2-methacryloyloxyethyl)phosphate (such as "MR-260" manufactured by DAIHACHI CHEMICAL INDUSTRY CO., LTD.), diethyl-(2-acryloyloxyethyl)phosphate (such as "DEAP" manufactured by UNION CHEMICAL CO., LTD.), resorcyl methacryloyl phosphate (such as "REOFOS RDP" manufactured by Ajinomoto Fine-Techno Co., Inc.), ethylene oxide (EO)-modified phosphoric acid tri(meth)acrylate (such as "Viscoat3PA" manufactured by OSAKA ORGANIC CHEMICAL INDUSTRY LTD.), 2-methacryloyloxyethyl acid phosphate (such as "LIGHT ESTER P-1M" manufactured by Kyoeisha Chemical Co., Ltd.), 2-acryloyloxyethyl acid phosphate (such as "LIGHT ESTER P-1A(N)" manufactured by Kyoeisha Chemical Co., Ltd.), 2-methacryloyloxyethyl acid phosphate (such as "LIGHT ESTER P-2M" manufactured by Kyoeisha Chemical Co., Ltd.), and 2,2,4,4,6,6hexa[2-(methacryloyloxy)-ethoxy]-1,3,5-triaza-2,4,6-triphosphorine (such as "PPZ" manufactured by Kyoeisha Chemical Co., Ltd.).

Advantageously, the formulation ratio of the component (F) being a flame-retardant polymerizable compound in the photo-curable composition is 1 part by weight or more and 50 parts by weight or less when the total of all components excluding the solvent being the component (D) is 100 parts by weight. The formulation ratio is preferably 5 parts by weight or more and 30 parts by weight or less, and more preferably 10 parts by weight or more and 20 parts by weight or less.

If the formulation ratio of the component (F) in the photo-curable composition is less than 1 part by weight, it will be impossible to achieve an effect of improving the dry etching resistance and thermal stability. If the formulation ratio is more than 50 parts by weight, the mechanical strength of the cured film will be low.

The photo-curable composition according to the present disclosure can contain both the component (E) being a flame retarder and the component (F) being a flame-retardant polymerizable compound. The formulation ratio in this case is advantageously such that the total weight of the component (E) and the component (F) is 1 part by weight or more and 50 parts by weight or less when the total of all components excluding the solvent being the component (D) is 100 parts by weight. The formulation ratio is preferably 5 parts by weight or more and 30 parts by weight or less, and more preferably 10 parts by weight or more and 20 parts by weight or less.

If the total weight of the component (E) and the component (F) is less than 1 part by weight, it will be impossible to achieve an effect of improving the dry etching resistance and thermal stability. If the total weight is more than 50 parts by weight, the mechanical strength of the cured film will be low.

<Temperature During Blending of Photo-Curable Composition>

When the photo-curable compositions according to this embodiment is prepared, at least the component (A) and the component (B) are mixed and dissolved under a predetermined temperature condition. Specifically, the preparation is performed in a range of from 0° C. or higher to 100° C. or lower. This applies also to the case where the additive component (C) is contained.

<Viscosity of Photo-Curable Composition>

The photo-curable composition according to this embodiment is preferably such that the viscosity of the mixture of the components excluding the solvent (component (D)) at 25° C. be 1 mPa·s or higher and 50 mPa·s or lower. Also, the viscosity is more preferably 1 mPa·s or higher and 30 mPa·s or lower, and further preferably 1 mPa·s or higher and 10 mPa·s or lower.

By setting the viscosity of the photo-curable composition at 50 mPa·s or lower, it will not take a long time to fill the photo-curable composition into the recessed portions of a minute pattern on a mold when the composition is brought into contact with the mold. In other words, by using the photo-curable composition according to this embodiment, a photo-nanoimprinting method can be implemented with high productivity. Moreover, pattern defects due to poor filling are unlikely to occur.

Also, when the photo-curable composition is coated onto a substrate, uneven coating is unlikely to occur by setting the viscosity at 1 mPa·s or higher. Further, when the photo-curable composition is brought into contact with a mold, the photo-curable composition is unlikely to flow out from the edges of the mold.

<Surface Tension of Photo-Curable Composition>

The photo-curable composition according to this embodiment is preferably such that the surface tension of the mixture of the components excluding the solvent (component (D)) at 23° C. is 5 mN/m or higher and 70 mN/m or lower. Also, the surface tension is more preferably 7 mN/m or higher and 35 mN/m or lower, and further preferably 10 mN/m or higher and 32 mN/m or lower. Here, by setting the surface tension at 5 mN/m or higher, it will not take a long time to fill the photo-curable composition into the recessed portions of a minute pattern on a mold when the composition is brought into contact with the mold.

Also, by setting the surface tension at 70 mN/m or lower, the cured film to be obtained by curing the photo-curable composition will be a cured film having a plane surface.

<Impurities Included in Photo-Curable Composition>

It is preferable that the photo-curable composition according to this embodiment contain as few impurities as possible. The impurities mentioned here mean substances other the above-described component (A), component (B), component (C), and component (D).

It is therefore preferable that the photo-curable composition according to this embodiment be obtained through a purification step. Such a purification step is preferably filtration using a filter or the like.

Specifically, in the case of performing filtration using a filter, it is preferable to mix the above-described component (A) and component (B) and an additive component(s) to be added as needed and then filter the mixture through a filter having a pore diameter of, for example, 0.001 µm or larger and 5.0 µm or smaller. In the case of performing filtration using a filter, it is more preferable to perform the filtration in many stages or repeat the filtration many times. Also, the filtered liquid may be filtered again. Filtration using a plurality of filters with different pore diameters may be performed. As the filter to be used in the filtration, a filter made of a polyethylene resin, a polypropylene resin, a fluororesin, a nylon resin, or the like can be used, but the filter is not particularly limited.

Through such a purification step, it is possible to remove impurities such as particles included in the photo-curable composition. Thus, it is possible to prevent generation of pattern defects due to impurities such as particles unintendedly forming asperities on the cured film obtained after curing the photo-curable composition.

Note that in the case of using the photo-curable composition according to this embodiment to prepare a semiconductor integrated circuit, it is preferable to avoid inclusion of impurities containing metallic atoms (metallic impurities) into the photo-curable composition as much as possible, in order not to impair the operation of the product. In such a case, the concentration of the metallic impurities contained in the photo-curable composition is preferably 10 ppm or lower and more preferably 100 ppb or lower.

[Method for Preparing Cured Film]

Figure 1:
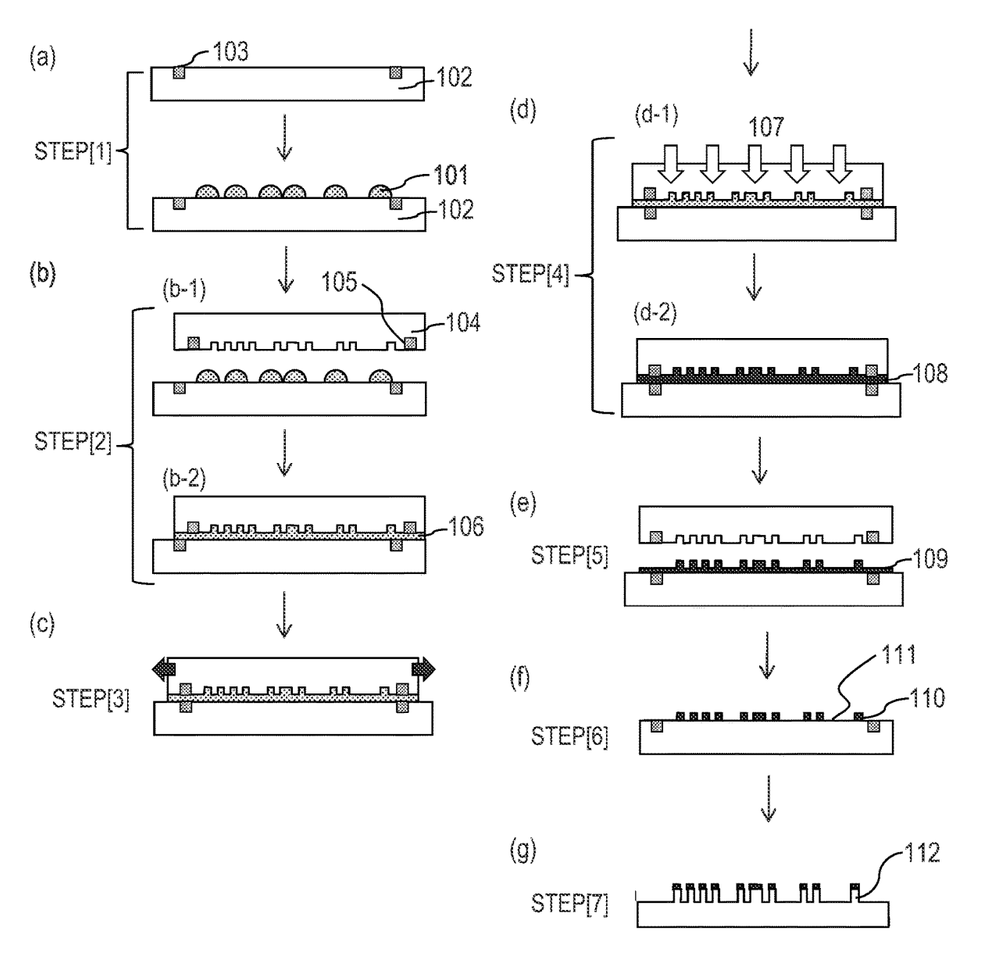

Next, a method for preparing a cured film according to this embodiment will be described. FIG. 1s a set of schematic cross-sectional views illustrating an example of the method for preparing a cured film according to this embodiment.

The method for preparing a cured film according to this embodiment includes:

an arranging step [1] of arranging the above-described photo-curable composition according to this embodiment onto a substrate;

a pressing step [2] of bringing the photo-curable composition and a mold into contact with each other;

a light applying step [4] of applying light onto the photo-curable composition; and a releasing step [5] of detaching the cured film obtained in the third step and the mold from each other.

The method for preparing a cured film having a pattern shape according to this embodiment is a film fabrication method utilizing a photo-nanoimprinting method.

A cured film obtained by the method for preparing a cured film having a pattern shape according to this embodiment is preferably a film having a pattern with a size of 1 nm or more and 10 mm or less. Also, it is more preferably a film having a pattern with a size of 10 nm or more and 100 µm or less. Note that a pattern formation technique for fabricating a film having a pattern (concavo-convex structure) with a size of nanometers (1 nm or more and 100 nm or less) by utilizing light is generally called a photo-nanoimprinting method. The method for preparing a cured film having a pattern shape according to this embodiment utilizes a photo-nanoimprinting method.

Each step will be described below.

<Arranging Step [1]>

In this step (arranging step), as illustrated in (a) of FIGURE, a photo-curable composition 101 according to this embodiment described above is arranged (coated) onto a substrate 102 to form a coated film.

The substrate 102 as the target on which to arrange the photo-curable composition 101 is a substrate to be processed, and a silicon wafer is usually used. Alternatively, a quartz substrate may be used as the substrate 102. In this way, it is possible to fabricate a replica of a quartz imprint mold (replica mold).

On the substrate to be processed, there may be asperities originating from substrate processing steps before the steps used in the present disclosure. The height difference between the asperities is about 1 to 1,000 nm, for example.

Note that in this embodiment, the substrate 102 is not limited to a silicon wafer. The substrate 102 can also be selected from among those known as semiconductor device substrates made of aluminum, a titanium-tungsten alloy, an aluminum-silicon alloy, an aluminum-copper-silicon alloy, a silicon oxide, a silicon nitride, or the like as desired. Note that a substrate whose adhesiveness with the photo-curable composition has been improved by a surface treatment such as a silane coupling treatment, a silazane treatment, or formation of an organic thin film may be used as the substrate 102 to be used (substrate to be processed).

In this embodiment, an inkjet method, a dip coating method, an air knife coating method, a curtain coating method, a wire-bar coating method, a gravure coating method, an extrusion coating method, a spin coating method, a slit scan method, or the like can be used as a method for arranging the photo-curable composition 101 onto the substrate 102, for example. For a photo-nanoimprinting method, it is particularly preferable to use an inkjet method. Note that the film thickness of the layer on which to transfer a shape (coated film) is, for example, 0.01 μm or more and 100.0 μm or less, though it varies depending on the application.

<Pressing Step [2]>

Thereafter, as illustrated in (b) of FIGURE, a mold 104 having an original pattern for transferring a pattern shape is brought into contact with the coated film made of the photo-curable composition 101 which was formed in the previous step (arranging step) ((b-1) of FIGURE). As a result, (part of) the coated film made of the photo-curable composition 101 is filled into the recessed portions of the minute pattern provided on the surface of the mold 104 and thus becomes a coated film 106 filled in the minute pattern on the mold ((b-2) of FIGURE).

As the mold 104, a mold 104 made of an optically transmissive material property is advantageously used in consideration of the next step (light applying step). As the material property of the mold 104, specifically, glass, quartz, an optically transparent resin such as PMMA or a polycarbonate resin, a transparent metal vapor-deposition film, a soft film of polydimethylsiloxane or the like, a photo-curable film, a metallic film, or the like is preferable. It is to be noted that in the case of using an optically transparent resin as the material property of the mold 104, it is necessary to select a resin that does not dissolve in the components contained in the photo-curable composition 101. The material property of the mold 104 is particularly preferably quartz since its coefficient of thermal expansion is small and thus pattern deformation is small.

It is preferable that the minute pattern provided on the surface of the mold 104 have a pattern height of 4 nm or more and 200 nm or less and an aspect ratio of 1 or more and 10 or less.

A surface treatment may be performed on the mold 104 before this step, which is a mold contacting step of bringing the photo-curable composition 101 and the mold 104 into contact with each other, to improve the releasability of the photo-curable composition 101 and the surface of the mold 104 from each other. Methods for the surface treatment include a method in which a release agent is coated onto the surface of the mold 104 to form a release agent layer. Here, the release agent to be coated onto the surface of the mold 104 includes a silicone-based release agent, a fluorine-based release agent, a hydrocarbon-based release agent, a polyethylene-based release agent, a polypropylene-based release agent, a paraffin-based release agent, a montan-based release agent, a carnauba-based release agent, and the like. For example, a commercially-available coating-type release agent such as OPTOOL DSX manufactured by DAIKIN INDUSTRIES, LTD can be preferably used. One kind of the release agents may be used alone, or two or more kinds thereof may be used in combination. Among these, the fluorine-based and hydrocarbon-based release agents are particularly preferable.

The pressure applied to the photo-curable composition 101 when the mold 104 and the photo-curable composition 101 are brought into contact with each other in this step (pressing step) as illustrated in (b-1) of FIG. 1s not particularly limited. Advantageously, this pressure is 0 MPa or higher and 100 MPa or lower. Also, this pressure is preferably 0 MPa or higher and 50 MPa or lower, more preferably 0 MPa or higher and 30 MPa or lower, and further preferably 0 MPa or higher and 20 MPa or lower.

Further, the time for which the mold 104 is brought into contact with the photo-curable composition 101 in this step is not particularly limited. Advantageously, this time is 0.1 second or longer and 600 seconds or shorter. Also, this time is preferably 0.1 second or longer and 300 seconds or shorter, more preferably 0.1 second or longer and 180 seconds or shorter, and particularly preferably 0.1 second or longer and 120 seconds or shorter.

While this step can be performed under any of conditions of an air atmosphere, a reduced pressure atmosphere, and an inert gas atmosphere, the reduced pressure atmosphere or the inert gas atmosphere is preferable since it can prevent oxygen and moisture from affecting the curing reaction. Specific examples of the inert gas usable in the case of performing this step under the inert gas atmosphere include nitrogen, carbon dioxide, helium, argon, various chlorofluorocarbon gases, and the like, and mixed gases thereof. In the case of performing this step under an atmosphere of a particular gas including the air atmosphere, a preferable pressure is 0.0001 atmosphere and higher and 10 atmospheres or lower.

The pressing step may be performed under an atmosphere containing a condensable gas (hereinafter referred to as "condensable gas atmosphere"). In this description, "condensable gas" refers to a gas that, when the gas in the atmosphere is filled in the recessed portions of the minute pattern formed on the mold 104 and in the gap between the mold and the substrate along with the (part of) coated film 106, gets condensed and liquefied by capillary pressure generated at the time of the filling. Note that the condensable gas is present in the form of a gas in the atmosphere before the photo-curable composition 101 (the layer on which to transfer a shape) and the mold 104 contact each other in the mold contacting step ((b-1) of FIGURE).

In the case where the mold contacting step is performed under the condensable gas atmosphere, the filling performance is excellent since the gas filled in the recessed portions of the minute pattern gets liquefied and bubbles disappear. The condensable gas may dissolve into the photo-curable composition 101.

The boiling point of the condensable gas is not limited as long as it is lower than or equal to the ambient temperature in the pressing step, but is preferably −10° C. to 23° C. and more preferably 10° C. to 23° C. Within these ranges, the filling performance is more excellent.

The vapor pressure of the condensable gas at the ambient temperature in the pressing step is not limited as long as it is lower than or equal to the pressure at which the mold is pressed in the pressing step, but is preferably 0.1 to 0.4 MPa. Within this range, the filling performance is more excellent. If the vapor pressure at the ambient temperature is higher than 0.4 MPa, a sufficient bubble vanishing effect tends not to be achieved. On the other hand, if the vapor pressure at the ambient temperature is lower than 0.1 MPa, depressurization is required and the apparatus tends to be complicated.

The ambient temperature in the pressing step is not particularly limited, but is preferably 20° C. to 25° C.

The condensable gas specifically includes fluorocabons including a chlorofluorocarbon (CFC) such as trichlorofluoromethane, a fluorocarbon (FC), hydrofluorocarbons (HFCs) such as hydrochlorofluorocarbon (HCFC) and 1,1,1,3,3-pentafluoropropane ($CHF_2CH_2CF_3$, HFC-245fa, PFP), and a hydrofluoroether (HFE) such as pentafluoroethyl methyl ether ($CF_3CF_2OCH_3$, HFE-245mc).

Among these, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferable in view of the fact that the filling performance is excellent when the ambient temperature in the pressing step is 20° C. to 25° C. Further, 1,1,1,3,3-pentafluoropropane is particularly preferable in view of the fact that it is excellent in safety.

One kind of the condensable gases may be used alone, or a mixture of two or more kinds thereof may be used. Also, a mixture of any of these condensable gases and a non-condensable gas such as air, nitrogen, carbon dioxide, helium, or argon may be used. Helium is preferable as the non-condensable gas to be mixed with the condensable gas in view of filling performance. Helium can pass through the mold 104. Thus, in the pressing step, when the gases in the atmosphere (the condensable gas and helium) are filled into the recessed portions of the minute pattern formed on the mold 104 along with the (part of) coated film 106, the condensable gas gets liquefied and the helium passes through the mold.

<Positioning Step [3]>

Thereafter, if necessary, the position of the mold and/or the substrate to be processed is adjusted such that mold-side positioning marks 105 and substrate-to-be-processed positioning marks 103 coincide with each other, as illustrated in (c) of FIGURE.

<Light Applying Step [4]>

Thereafter, as illustrated in (d) of FIGURE, in the positioned state obtained by the step [3], light is applied through the mold 104 to the contacting portion of the photo-curable composition 101 and the mold 104. More specifically, light is applied through the mold 104 to the coated film 106 filled in the minute pattern of the mold ((d-1) of FIGURE). As a result, the coated film 106 filled in the minute pattern on the mold 104 is cured by the applied light and turns into a cured film 108 ((d-2) of FIGURE).

Here, the light to be applied to the photo-curable composition 101 forming the coated film 106 filled in the minute pattern on the mold 104 is selected according to the wavelengths which the photo-curable composition 101 is sensitive to. Specifically, it is preferable to select and use ultraviolet rays with wavelengths of 150 nm or longer and 400 nm or shorter, X rays, electron rays, or the like as appropriate.

Among these, the ultraviolet rays are particularly preferable as the light to be applied to the photo-curable composition 101 (applied light 107). This is because many of curing aids (photopolymerization initiators) that are commercially available are compounds having sensitivity to ultraviolet rays. Here, examples of the light source that emits the ultraviolet rays include a high-pressure mercury vapor lamp, an ultra-high-pressure mercury vapor lamp, a low-pressure mercury vapor lamp, a deep-UV lamp, a carbon arc lamp, a chemical lamp, a metal halide lamp, a xenon lamp, a KrF excimer laser, an ArF excimer laser, an $F_2$ excimer laser, and so on, and the ultra-high-pressure mercury vapor lamp is particularly preferable. Also, the number of light sources to be used may be one or be two or more. Moreover, the light may be applied to the entire surface of the coated film 106 filled in the minute pattern on the mold or be applied only to a partial region.

Also, the light may be applied a plurality of times intermittently over the entire region of the substrate or applied continuously over the entire region. Further, the light may be applied to a partial region A in a first application step and applied to a region B different from the region A in a second application step.

<Releasing Step [5]>

Thereafter, the cured film 108 and the mold 104 are detached from each other. By this point, a cured film 109 having a predetermined pattern shape has been formed on the substrate 102.

In this step (releasing step), as illustrated in (e) of FIGURE, the cured film 108 and the mold 104 are detached from each other, so that a cured film 109 having a pattern shape formed in the step [4] (light applying step) as an inverted pattern of the minute pattern formed on the mold 104 is obtained.

Note that in the case where the mold contacting step has been performed under a condensable gas atmosphere, when the cured film 108 and the mold 104 are detached from each other in the releasing step, the pressure of the interface at which the cured film 108 and the mold 104 contact each other drops, so that the condensable gas vaporizes. This tends to bring about an effect of reducing the releasing force being the force required to detach the cured film 108 and the mold 104 from each other.

The method for detaching the cured film 108 and the mold 104 from each other is not particularly limited as long as it does not physically damage any part of the cured film 108 in the detachment, and various conditions and the like are not particularly limited either. For example, the substrate 102 (substrate to be processed) may be fixed, and the mold 104 may be moved away from the substrate 102 to be released. Alternatively, the mold 104 may be fixed, and the substrate 102 may be moved away from the mold to be released. Still alternatively, both of them may be pulled in opposite directions to be released from each other.

With a series of steps (preparation process) including the above-described steps [1] to [5], it is possible to obtain a cured film having a desired concavo-convex pattern shape (a pattern shape originating from the concavo-convex shape on the mold 104) at a desired position. The obtained cured film can be utilized as, for example, an optical member such as a Fresnel lens or a diffraction grating (this includes a case where the cured film is used as a part of an optical member). In such a case, the optical member can be one having at least the substrate 102 and the cured film 109 with a pattern shape arranged on this substrate 102.

In the method for preparing a cured film according to this embodiment, a repetition unit (shot) including the steps [1] to [5] can be repetitively performed on the same substrate to be processed a plurality of times. By repeating a repetition unit (shot) including the steps [1] to [5] a plurality of times, it is possible to obtain a cured film having a plurality of desired concavo-convex pattern shapes (pattern shapes originating from the concavo-convex shape on the mold 104) at desired positions on a substrate to be processed.

<Residual Film Removing Step [6] of Removing Part of Cured Film>

There is a case where the cured film obtained by the releasing step being the step [5] has a particular pattern shape but part of the cured film remains in regions other than the region where this pattern is formed (hereinafter, such part of the cured film will be referred to as "residual film". In such a case, in the obtained cured film having the pattern shape, the cured film present in all regions to be removed (residual film) is removed, as illustrated in (f) of FIGURE. In this way, a cured film pattern 110 having the desired concavo-convex pattern shape (the pattern shape originating from the concavo-convex shape on the mold 104) can be obtained.

Here, examples of the method for removing the residual film include a method in which the cured film (residual film) being the recessed portions of the cured film 109 is removed by a method such as etching to thereby expose the surface of the substrate 102 at the recessed portions of the pattern of the cured film 109.

In the case of removing the cured film at the recessed portions of the cured film 109 by etching, the specific method therefor is not particularly limited, and a publicly known conventional method, e.g., dry etching, can be used. For the dry etching, a publicly known conventional dry etching apparatus can be used. Moreover, the source gas for the dry etching is selected as appropriate according to the elemental constitution of the cured film to be subjected to the etching, and it is possible to use a gas including a halogen-based gas such as $CF_4$, $CHF_3$, $C_2F_6$, $C_3F_7$, $C_4F_8$, $CCl_2F_2$, $CCl_4$, $CBrF_3$, $BCl_3$, $PCl_3$, $SF_6$, or $Cl_2$, a gas containing an oxygen atom(s) such as $O_2$, CO, or $CO_2$, an inert gas such as He, $N_2$, or Ar, $H_2$, $NH_3$, or the like. Note that a mixture of these gases can also be used.

With the preparation process including the above steps [1] to [6], it is possible to obtain the cured film pattern 110 having a desired concavo-convex pattern shape (the pattern shape originating from the concavo-convex shape on the mold 104) at a desired position and obtain a product having the cured film pattern. Further, in the case of processing the substrate 102 by utilizing the obtained cured film pattern 110, a later-described substrate processing step (step [7]) is performed.

Alternatively, the obtained cured film pattern 110 can be utilized as an optical member such as a diffraction grating or a polarizing plate (this includes a case where the cured film pattern 110 is used as a part of an optical member) to obtain an optical component. In such a case, the optical component can be one having at least the substrate 102 and the cured film pattern 110 arranged on this substrate 102.

<Substrate Processing Step [7]>

The cured film pattern 110 with a concavo-convex pattern shape obtained by the method for preparing a cured film having a pattern shape according to this embodiment can also be utilized, for example, as a film for an interlayer insulator included in an electrical component of a semiconductor device or the like. Alternatively, the cured film pattern 110 can be utilized as a resist film in the preparation of a semiconductor device. Examples of the semiconductor device mentioned here include an LSI, a system LSI, a DRAM, a SDRAM, a RDRAM, a D-RDRAM, and the like.

In the case of utilizing the cured film pattern 110 as a resist film, etching, ion implantation, or the like is performed on the part of the substrate where its surface has been exposed in the etching step being the step [6] (the region with reference sign 111 in ((f) of FIGURE). Note that the cured film pattern 110 functions as an etching mask in this operation. In addition, an electrical component can be formed to form a circuit structure 112 ((g) of FIGURE) based on the pattern shape of the cured film pattern 110 on the substrate 102. Consequently, a circuit substrate to be utilized in a semiconductor device or the like can be prepared. Also, by connecting this circuit substrate and a circuit control mechanism for the circuit substrate and the like, it is possible to form an electrical instrument, such as a display, a camera, or a medical apparatus.

Alternatively, etching, ion implantation, or the like can be performed by likewise utilizing the cured film pattern 110 as a resist film to obtain an optical component.

In the case of etching the part of the substrate where its surface is exposed by utilizing the cured film pattern 110 as a resist film, dry etching can be used. For the dry etching, a publicly known conventional dry etching apparatus can be used. Moreover, the source gas for the dry etching is selected as appropriate according to the elemental constitution of the cured film to be subjected to the etching, and it is possible to use a gas including a halogen-based gas such as $CF_4$, $CHF_3$, $C_2F_6$, $C_3F_8$, $C_4F_8$, $CCl_2F_2$, $CCl_4$, $CBrF_3$, $BCl_3$, $PCl_3$, $SF_6$, or $Cl_2$, a gas containing an oxygen atom(s) such as $O_2$, CO, or $CO_2$, an inert gas such as He, $N_2$, or Ar, $H_2$, $NH_3$, or the like. A fluorine-based gas such as $CF_4$, $CHF_3$, $C_2F_6$, $C_3F_8$, $C_4F_8$, $CCl_2F_2$, $CBrF_3$, or $SF_6$ is preferable. This is because the photo-curable composition according to this embodiment exhibits high resistance against dry etching with the above fluorine-based gases. Note that a mixture of these gases can also be used.

Note that in the case of fabricating a circuit substrate or the like, the cured film pattern 110 may eventually be removed from the processed substrate, but may be left as a constituent member of an element.

A transparent substrate of quartz or the like may be used as the substrate 102, a cured film pattern may be formed on the surface of the transparent substrate, and the pattern may be transferred to the transparent substrate. In this way, it is possible to fabricate a replica of an imprint mold (replica mold).

<Planing Method>

In an embodiment of the present disclosure, a cured film having a plane surface may be prepared for the purpose of planing a substrate to be processed having asperities. In a planing method, in the above-described pressing step [2], a plane mold with a plane surface that is to be in contact with the photo-curable composition 101 is used in place of the mold 104 with a minute pattern. It is preferable that the height difference between the asperities on the surface of the plane mold be 4 nm or less. By performing a light applying step [4] and a releasing step [5] in a similar manner to the above with the plane mold pressed, it is possible to obtain a cured film whose surface is as plane as the plane mold.

It is possible to perform a photolithography step by coating a photoresist directly onto the plane cured film obtained by the above planing method. Alternatively, it is possible to perform a photolithography step by laminating a spin-on-glass (SOG) film or a silicon oxide layer and coating a photoresist onto it. Consequently, a circuit substrate to be utilized in a semiconductor device or the like can be prepared. Also, by connecting this circuit substrate and a circuit control mechanism for the circuit substrate and the like, it is possible to form an electrical instrument, such as a display, a camera, or a medical apparatus. Examples of the semiconductor device mentioned here include an LSI, a system LSI, a DRAM, a SDRAM, a RDRAM, a D-RDRAM, a NAND flash, and the like.

EXAMPLES

The present disclosure will be described below in more detail by way of examples. However, the technical scope of the present disclosure is not limited to the examples to be described below.

(Adjustment of Photo-Curable Composition)

Comparative Example 1

(1) Preparation of Photo-Curable Composition (b-1)

A photo-curable composition (b-1) of Comparative Example 1 was obtained by blending a component (A), a component (B), a component (E), and a component (F) listed below and filtering the mixture through a 0.2-μm filter made of ultra-high-molecular-weight polyethylene.

(1-1) Component (A): 97 parts by weight in total
<A-1> Benzyl acrylate (manufactured by OSAKA ORGANIC CHEMICAL INDUSTRY LTD., Product name: V #160): 50 parts by weight
<A-2> Neopentyl glycol diacrylate (manufactured by Kyoeisha Chemical Co., Ltd., Product name: NP-A): 47 parts by weight
(1-2) Component (B): 3 parts by weight in total
<B-1> Lucirin TPO (manufactured by BASF): 3 parts by weight
(1-3) Component (E): None
(1-4) Component (F): None

Example 1

(1) Preparation of Photo-Curable Composition (a-1)

A photo-curable composition (a-1) of Example 1 was obtained by blending a component (A), a component (B), a component (E), and a component (F) listed below and filtering the mixture through a 0.2-μm filter made of ultra-high-molecular-weight polyethylene. (1-1) Component (A): 82 parts by weight in total
<A-1> Benzyl acrylate (manufactured by OSAKA ORGANIC CHEMICAL INDUSTRY LTD., Product name: V #160): 50 parts by weight
<A-2> Neopentyl glycol diacrylate (manufactured by Kyoeisha Chemical Co., Ltd., Product name: NP-A): 32 parts by weight
(1-2) Component (B): 3 parts by weight in total
<B-1> Lucirin TPO (manufactured by BASF): 3 parts by weight
(1-3) Component (E): None
(1-4) Component (F): Pentabromophenyl acrylate (manufactured by Sigma-Aldrich, Abbreviated name: 5BrPMA): 15 parts by weight

Example 2

(1) Preparation of Photo-Curable Composition (a-2)

A photo-curable composition (a-2) of Example 2 was obtained by blending a component (A), a component (B), a component (E), and a component (F) listed below and filtering the mixture through a 0.2-μm filter made of ultra-high-molecular-weight polyethylene.

(1-1) Component (A): 82 parts by weight in total
<A-1> Benzyl acrylate (manufactured by OSAKA ORGANIC CHEMICAL INDUSTRY LTD., Product name: V #160): 50 parts by weight
<A-2> Neopentyl glycol diacrylate (manufactured by Kyoeisha Chemical Co., Ltd., Product name: NP-A): 32 parts by weight
(1-2) Component (B): 3 parts by weight in total
<B-1> Lucirin TPO (manufactured by BASF): 3 parts by weight
(1-3) Component (E): None
(1-4) Component (F): 2,4,6-Tribromophenyl acrylate (manufactured by Sigma-Aldrich, Abbreviated name: 3BrA): 15 parts by weight

Example 3

(1) Preparation of Photo-Curable Composition (a-3)

A photo-curable composition (a-3) of Example 3 was obtained by blending a component (A), a component (B), a component (E), and a component (F) listed below and filtering the mixture through a 0.2-μm filter made of ultra-high-molecular-weight polyethylene.

(1-1) Component (A): 82 parts by weight in total
<A-1> Benzyl acrylate (manufactured by OSAKA ORGANIC CHEMICAL INDUSTRY LTD., Product name: V #160): 50 parts by weight
<A-2> Neopentyl glycol diacrylate (manufactured by Kyoeisha Chemical Co., Ltd., Product name: NP-A): 32 parts by weight
(1-2) Component (B): 3 parts by weight in total
<B-1> Lucirin TPO (manufactured by BASF): 3 parts by weight
(1-3) Component (E): None
(1-4) Component (F): 2-Methacryloyloxy ethyl acid phosphate (manufactured by Kyoeisha Chemical Co., Ltd., Abbreviated name: P-2M): 15 parts by weight

Example 4

(1) Preparation of Photo-Curable Composition (a-4)

A photo-curable composition (a-4) of Example 4 was obtained by blending a component (A), a component (B), a component (E), and a component (F) listed below and filtering the mixture through a 0.2-μm filter made of ultra-high-molecular-weight polyethylene.

(1-1) Component (A): 82 parts by weight in total
<A-1> Benzyl acrylate (manufactured by OSAKA ORGANIC CHEMICAL INDUSTRY LTD., Product name: V #160): 50 parts by weight
<A-2> Neopentyl glycol diacrylate (manufactured by Kyoeisha Chemical Co., Ltd., Product name: NP-A): 32 parts by weight
(1-2) Component (B): 3 parts by weight in total
<B-1> Lucirin TPO (manufactured by BASF): 3 parts by weight
(1-3) Component (E): None
(1-4) Component (F): Ethylene oxide (EO)-modified phosphoric acid tri(meth)acrylate (manufactured by OSAKA ORGANIC CHEMICAL INDUSTRY LTD., Abbreviated name: 3PA): 15 parts by weight

Example 5

(1) Preparation of Photo-Curable Composition (a-5)

A photo-curable composition (a-5) of Example 5 was obtained by blending a component (A), a component (B), a component (E), and a component (F) listed below and filtering the mixture through a 0.2-μm filter made of ultra-high-molecular-weight polyethylene.

(1-1) Component (A): 87 parts by weight in total
<A-1> Benzyl acrylate (manufactured by OSAKA ORGANIC CHEMICAL INDUSTRY LTD., Product name: V #160): 40 parts by weight <A-2> Neopentyl glycol diacrylate (manufactured by Kyoeisha Chemical Co., Ltd., Product name: NP-A): 47 parts by weight (1-2) Component (B): 3 parts by weight in total <B-1> Lucirin TPO (manufactured by BASF): 3 parts by weight (1-3) Component (E): Triphenyl phosphate (manufactured by DAIHACHI CHEMICAL INDUSTRY CO., LTD., Product name: TPP): 10 parts by weight (1-4) Component (F): None Example 6

(1) Preparation of Photo-Curable Composition (a-6)

A photo-curable composition (a-6) of Example 6 was obtained by blending a component (A), a component (B), a component (E), and a component (F) listed below and filtering the mixture through a 0.2-µm filter made of ultra-high-molecular-weight polyethylene.

(1-1) Component (A): 87 parts by weight in total

<A-1> Benzyl acrylate (manufactured by OSAKA ORGANIC CHEMICAL INDUSTRY LTD., Product name: V #160): 40 parts by weight <A-2> Neopentyl glycol diacrylate (manufactured by Kyoeisha Chemical Co., Ltd., Product name: NP-A): 47 parts by weight (1-2) Component (B): 3 parts by weight in total <B-1> Lucirin TPO (manufactured by BASF): 3 parts by weight (1-3) Component (E): None (1-4) Component (F): Diphenyl-(2-methacryloyloxyethyl)phosphate (manufactured by DAIHACHI CHEMICAL INDUSTRY CO., LTD., Product name: MR-260): 10 parts by weight Example 7

(1) Preparation of Photo-Curable Composition (a-7)

A photo-curable composition (a-7) of Example 7 was obtained by blending a component (A), a component (B), a component (E), and a component (F) listed below and filtering the mixture through a 0.2-µm filter made of ultra-high-molecular-weight polyethylene.

(1-1) Component (A): 87 parts by weight in total

<A-1> Benzyl acrylate (manufactured by OSAKA ORGANIC CHEMICAL INDUSTRY LTD., Product name: V #160): 40 parts by weight <A-2> Neopentyl glycol diacrylate (manufactured by Kyoeisha Chemical Co., Ltd., Product name: NP-A): 47 parts by weight (1-2) Component (B): 3 parts by weight in total <B-1> Lucirin TPO (manufactured by BASF): 3 parts by weight (1-3) Component (E): Triphenyl phosphate (manufactured by DAIHACHI CHEMICAL INDUSTRY CO., LTD., Product name: TPP): 5 parts by weight (1-4) Component (F): Diphenyl-(2-methacryloyloxyethyl)phosphate (manufactured by DAIHACHI CHEMICAL INDUSTRY CO., LTD., Product name: MR-260): 5 parts by weight (Formation of Cured Film)

2 µL of each of the photo-curable compositions of Comparative Example and Examples is dripped onto a silicon wafer. Then, each photo-curable composition is covered with 1 mm-thick quartz glass from above to be filled in a square region measuring 25 mm along each side.

Then, light emitted from a UV light source equipped with an ultra-high-pressure mercury vapor lamp and passing through an interference filter is applied to each coated film through the quartz glass for 200 seconds. VPF-25C-10-15-31300 (manufactured by SIGMAKOKI CO., LTD.) is used as the interference filter, the ultraviolet ray being the light applied here is a single-wavelength ray with a wavelength of 313±5 nm, and the light intensity is 1 mW/cm$^2$.

After the application of the light, the quartz glass is taken off. As a result, a cured film of each photo-curable composition having an average film thickness of 3.2 µm is obtained on the silicon wafer.

(Evaluation of Dry Etching Resistance)

The dry etching resistance of the cured film of each photo-curable composition can be evaluated by performing dry etching on the cured film with a dry etching technique and measuring the film thickness before and after the dry etching. For example, using a high-density plasma etching apparatus NE-550 manufactured by ULVAC, Inc., dry etching is performed on each cured film for 500 seconds with $CF_4$ and $CHF_3$ as the etching gas at a flow rate of $CF_4$/$CHF_3$=50 sccm/50 sccm. The dry etching rate (nm/s) can be calculated by measuring the film thickness (nm) reduced by the dry etching and dividing it by the dry etching time, which is 500 seconds. Note that a lower dry etching rate means a higher dry etching resistance.

In Examples, the flame retarder or the flame-retardant polymerizable compound provides chemical stability against active radicals, so that the dry etching resistance is expected to be higher than that in Comparative Example.

(Evaluation of Thermal Stability)

By using a thermogravimetric analysis technique (TGA), it is possible to evaluate the thermal stability of the cured films of the photo-curable compositions in Comparative Example and Examples. For example, it is possible to compare the rates of thermogravimetric decrease in the case of heating the cured films of the photo-curable compositions at 300° C. for 2 minutes under an air atmosphere, then cooling the cured films to 25° C., and again heating the cured films from 25° C. to 300° C. under a condition of 20° C./min (the rates of thermogravimetric decrease at 300° C. in this case) as an index for the evaluation of the thermal stability.

In Examples, the rates of thermogravimetric decrease lower than that in Comparative Example are obtained owing to the combustion inhibition effect of the flame retarder or the flame-retardant polymerizable compound. The rates of thermogravimetric decrease at 300° C. in Comparative Example 1 and Examples 1 to 4 are shown in Table 1.

TABLE 1

|  | Comparative Example 1 | Example 1 | Example 2 | Example 3 | Example 4 |
|---|---|---|---|---|---|
| The rate of thermogravimetric decrease at 300° C. | 5.9% | 2.0% | 1.0% | 0.8% | 0.8% |

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of U.S. Provisional Patent Application No. 63/041,192, filed Jun. 19, 2020, which is hereby incorporated by reference herein in its entirety.

What is claimed is:

1. A photo-curable composition comprising at least:
a polymerizable compound (A); and
a photopolymerization initiator (B),
wherein the photo-curable composition further comprises at least one selected from the group consisting of:
a flame retarder (E); and
a flame-retardant polymerizable compound (F),
wherein the photo-curable composition does not include particles larger than 0.2 μm and has a viscosity of 30.0 mPa·s or lower, and
wherein a rate of thermogravimetric decrease is 2.0% or less in a case where the photo-curable composition in a state without a solvent is cured by applying light onto the photo-curable composition in contact with a mold to obtain a cured film, and the cured film is heated at 300° C. for 2 minutes, then cooled to 25° C., and heated from 25° C. to 300° C. under a condition of 20° C./min.

2. The photo-curable composition according to claim 1, wherein the flame retarder (E) is at least one compound selected from the group consisting of brominated phenyl compounds, condensed phosphate ester compounds, halogen-containing phosphate ester compounds, non-halogen-based aliphatic phosphate ester compounds, non-halogen-based aromatic phosphate ester compounds, and melamine compounds.

3. The photo-curable composition according to claim 1, wherein the flame retarder (E) is at least one compound selected from the group consisting of pentabromodiphenyl ether, octabromodiphenyl ether, decabromodiphenyl ether, tetrabromobisphenol A, hexabromocyclododecane, hexabromobenzene, resorcinol bis(diphenyl)phosphate, 1,3-phenylene bis(diphenyl phosphate), 1,3-phenylene bis(dixylenyl)phosphate, bisphenol A bis(diphenyl phosphate), phosphonitrilic acid phenyl ester, tris(chloroethyl)phosphate, tris(2,3-dichloropropyl)phosphate, tris(2-chloropropyl)phosphate, tris(2,3-bromopropyl)phosphate, tris(bromochloropropyl)phosphate, 2,3-dibromopropyl-2,3-chloropropyl phosphate, tris(tribromophenyl)phosphate, tris(dibromophenyl)phosphate, tris(tribromoneopentyl) phosphate, trimethyl phosphate, triethyl phosphate, tributyl phosphate, trioctyl phosphate, tributoxyethyl phosphate, triphenyl phosphate, cresyl diphenyl phosphate, dicresyl phenyl phosphate, tricresyl phosphate, trixylenyl phosphate, xylenyl diphenyl phosphate, tris(isopropylphenyl)phosphate, isopropylphenyl diphenyl phosphate, diisopropylphenyl phenyl phosphate, tris(trimethylphenyl)phosphate, tris(t-butylphenyl)phosphate, hydroxyphenyl diphenyl phosphate, octyl diphenyl phosphate, triallyl phosphate, melamine polyphosphate, chlorinated paraffin, polychlorinated biphenyl, melamine cyanurate, tris(2,4-ditertiary butylphenyl)phosphite, 2,6-ditertiary butyl-4-(4,6-bis(octylthio)-1,3,5-triazine-2-ylamino)phenol, and didodecyl-3,3'-thiodipropionate.

4. The photo-curable composition according to claim 1, wherein the flame-retardant polymerizable compound (F) is a compound containing both a polymerizable functional group and a brominated phenyl group or a phosphate ester group as a flame retardant structure within a single molecule.

5. The photo-curable composition according to claim 1, wherein a weight of the flame retarder (E) or the flame-retardant polymerizable compound (F) is 1 part by weight to 50 parts by weight when a total of all components excluding a solvent being a component (D) is 100 parts by weight.

6. The photo-curable composition according to claim 1, wherein a total weight of the flame retarder (E) and the flame-retardant polymerizable compound (F) is 1 part by weight to 50 parts by weight when a total of all components excluding a solvent being a component (D) is 100 parts by weight.

7. The photo-curable composition according to claim 1, wherein the photo-curable composition contains no solvent.

8. The photo-curable composition according to claim 1, wherein the photo-curable composition has the viscosity of 30.0 mPa·s or lower when it contains no solvent.

9. The photo-curable composition according to claim 1, wherein the photo-curable composition has the viscosity of 30.0 mPa·s or lower when it contains a solvent (D) and has the viscosity of 1000.0 mPa·s or lower without the solvent (D).

10. A method for preparing a cured film, comprising:
an arranging step of arranging the photo-curable composition according to claim 1 onto a substrate;
a pressing step of bringing the photo-curable composition and a mold into contact with each other;
a light applying step of applying light onto the photo-curable composition to turn the photo-curable composition into a cured product; and
a releasing step of detaching the cured product and the mold from each other after the light applying step.

11. The method for preparing a cured film according to claim 10, further comprising:
a heating step of heating the cured product at 250° C. or more for 1 minute or more after the releasing step.

12. A method for preparing a circuit substrate, comprising:
a step of obtaining a cured film with a pattern by performing a lithography step on the cured film prepared by the method according to claim 10, and performing etching or ion implantation on the substrate by using the cured film with the pattern as a mask; and
a step of removing the cured film with the pattern.

13. The method for preparing a cured film according to claim 10, wherein a pattern is formed on at least at a portion of a surface of the mold to be brought into contact with the photo-curable composition.

14. A method for preparing an optical component, comprising a step of obtaining a cured film with a pattern by the method for preparing a cured film according to claim 13.

15. A method for preparing a circuit substrate, comprising:
a step of obtaining a cured film by the method for preparing a cured film according to claim 13;
a step of performing etching or ion implantation on the substrate by using the obtained cured product pattern as a mask; and
a step of removing the cured product pattern.

16. The method for preparing a circuit substrate according to claim 12, wherein the etching is performed using a gas containing at least one of $CF_4$, $CHF_3$, $C_2F_6$, $C_3F_8$, $C_4F_8$, $CCl_2F_2$, $CBrF_3$, and $SF_6$.

17. The method for preparing a circuit substrate according to claim 16, wherein the circuit substrate is a circuit substrate for use in a semiconductor device.

18. A method for preparing a replica mold, comprising the method for preparing a cured film according to claim 13, wherein the substrate is a quartz substrate.

19. The method for preparing a cured film according to claim 10, wherein
the substrate has a surface with asperities, and
a surface of the mold has a plane portion at least at a section to be brought into contact with the photo-curable composition.

20. A method for preparing a cured film, comprising, in this order:
- an arranging step of arranging droplets of the photo-curable composition according to claim 1 onto a substrate having a surface with asperities by dropping the droplets discretely;
- a waiting step of waiting until a surface of a layer of the photo-curable composition becomes plane; and
- a light applying step of applying light to cure the layer of the photo-curable composition.

* * * * *